(12) United States Patent
Russo

(10) Patent No.: US 9,903,061 B2
(45) Date of Patent: Feb. 27, 2018

(54) LAUNDRY APPLIANCE PROVIDED WITH A CONTROL-PANEL ASSEMBLY

(71) Applicant: Electrolux Appliances Aktiebolag, Stockholm (SE)

(72) Inventor: Riccardo Russo, Pordenone (IT)

(73) Assignee: Electrolux Appliances Aktiebolag, Stockholm (SE)

( * ) Notice: Subject to any disclaimer, the term of this patent is extended or adjusted under 35 U.S.C. 154(b) by 0 days.

(21) Appl. No.: 14/911,907

(22) PCT Filed: Jul. 29, 2014

(86) PCT No.: PCT/EP2014/066232
§ 371 (c)(1),
(2) Date: Feb. 12, 2016

(87) PCT Pub. No.: WO2015/022177
PCT Pub. Date: Feb. 19, 2015

(65) Prior Publication Data
US 2016/0194804 A1    Jul. 7, 2016

(30) Foreign Application Priority Data

Aug. 13, 2013  (EP) .................................... 13180209

(51) Int. Cl.
*D06F 39/00* (2006.01)
*D06F 39/12* (2006.01)
(Continued)

(52) U.S. Cl.
CPC ............ *D06F 39/005* (2013.01); *D06F 39/12* (2013.01); *D06F 58/28* (2013.01);
(Continued)

(58) Field of Classification Search
CPC .......... D06F 39/00; D06F 58/28; H03K 17/96
(Continued)

(56) References Cited

U.S. PATENT DOCUMENTS

2004/0148972 A1    8/2004  Kang
2007/0285872 A1*  12/2007  Jeong .................. H03K 17/962
                                                                    361/272
(Continued)

FOREIGN PATENT DOCUMENTS

EP    2380479 A1   10/2011
EP    2415925 A1    2/2012
(Continued)

OTHER PUBLICATIONS

International Search Report dated Sep. 19, 2014 in corresponding International Application No. PCT/EP2014/066232.

*Primary Examiner* — Edwin A. Leon
*Assistant Examiner* — Iman Malakooti
(74) *Attorney, Agent, or Firm* — Banner & Witcoff, Ltd.

(57) ABSTRACT

A laundry appliance (1) has a control-panel assembly (3, 30) having:
- an outer shell (5) which is coupled to a casing of the laundry appliance and provides a user interface;
- an internal printed circuit board (6) provided with one or more sensors; and
- a protecting box (7) firmly attached to the printed circuit board (6) and at least partially interposed between the outer shell and the printed circuit board;
- one or more spring detectors (18) which transmit to the one or more sensors a signal related to the capacitive variation that is generated when the user interface is touched.

The protecting box (7) has one or more head zones (11) compressing the one or more spring detectors (18) when the protecting box (7) is attached to the printed circuit board (6). The capacitive variation is sensed by the one or more spring detectors (18) through the one or more head zones (11).

12 Claims, 7 Drawing Sheets

(51) Int. Cl.
*H03K 17/96* (2006.01)
*D06F 58/28* (2006.01)

(52) U.S. Cl.
CPC . *H03K 17/9622* (2013.01); *D06F 2058/2883* (2013.01); *H03K 2217/96076* (2013.01); *H03K 2217/960755* (2013.01)

(58) Field of Classification Search
USPC .................................. 200/5 A, 600; 361/759
See application file for complete search history.

(56) References Cited

U.S. PATENT DOCUMENTS

2010/0025214 A1* 2/2010 Roose .................. D06F 39/005
    200/5 A
2014/0049926 A1* 2/2014 Bas ...................... D06F 39/005
    361/759

FOREIGN PATENT DOCUMENTS

| EP | 2458060 A1 | 5/2012 |
|----|------------|--------|
| WO | 2013064572 A1 | 5/2013 |

* cited by examiner

LAUNDRY APPLIANCE PROVIDED WITH A CONTROL-PANEL ASSEMBLY

FIELD

The present invention relates to a laundry appliance (called also laundry machine) provided with an improved control-panel assembly.

In particular the present invention relates to a control-panel assembly for laundry washing and/or drying machines, to which the following description refers purely by way of example without implying any loss of generality.

BACKGROUND

As it is known, most of currently marketed front-loading laundry washing and/or drying machines comprise: a substantially parallelepiped-shaped, rigid outer boxlike casing structured for resting on the floor; a substantially bell-shaped washing tub which is suspended in floating manner inside the casing, directly facing a laundry loading and unloading through opening realized in the front face of the casing; a substantially cylindrical, elastically-deformable bellows which connects the front opening of the washing tub to the laundry loading and unloading opening formed in the front face of the casing; a porthole door which is hinged to the front face of the casing to rotate to and from a closing position in which the door closes the laundry loading and unloading through opening in the front face of the casing to seal the washing tub; and a substantially cylindrical, bell-shaped revolving drum structured for housing the laundry to be washed and/or dried, and which is housed inside the washing tub in axially rotating manner about its substantially horizontally-oriented longitudinal axis.

In addition to the above, known laundry washing and/or drying machines are typically provided with an electrically-powered motor assembly which is located immediately outside of the washing tub, and which is structured for selectively driving into rotation the revolving drum about its longitudinal axis inside the washing tub; with an outer manually-operated control panel which is usually located on the front face of the casing, immediately above the laundry loading and unloading opening; and with an electronic central control unit which is structured for directly controlling the electric motor of the motor assembly and other electrically-operated component parts of the household appliance, according to the washing and/or drying cycle selected by the user via the control panel.

In most of the currently marketed laundry washing and/or drying machines, the manually-operated control panel comprises: a rigid shell-shaped dashboard which usually forms part of the upper portion of the front face of the outer boxlike casing; an internal printed circuit board which is generally provided with one or more manually-operated rotatable knob selectors and/or buttons and/or switches and/or LED warning lights and/or alphanumeric displays necessary for allowing the user to manually select the desired washing and/or drying cycle among the ones stored in the central control unit; and a substantially basin-shaped, rigid protecting box, which houses and directly supports the printed circuit board, and is structured for being firmly fixed to the back of the dashboard via anchoring screws.

Generally, the outer dashboard, is provided with a number of pass-through openings and/or seats which are spatially arranged and dimensioned for being engaged respectively by a shaft of the rotatable knob selector, and by the other buttons, switches, warning lights and/or alphanumeric displays of the printed circuit board, so that the shaft of the knob selector, and each other button, switch, warning light, and/or alphanumeric display projecting out of the protecting box can fit into a corresponding pass-through opening or seat of the dashboard.

It is preferable that the mounting of the control panel be as easy and fast as possible during manufacturing and maintenance. In particular, when printed circuit board comprises capacitive sensors, the control panel is further provided with a spring detector connected to capacitive sensor provided on the printed circuit board, and pressed with its free end on the internal surface of the outer dashboard. When a finger of the user properly approaches the dashboard near a spring detector and/or touches the dashboard close to a spring detector, resulting capacity changes are processed by the printed circuit board and converted into a command for the laundry appliance. Each spring detector is associated to a capacitive command button and spring detectors shall be properly compressed during mounting for functioning of the capacitive button. Furthermore, each spring detector comprises a floating free end that may hook an adjacent spring detector or be damaged during handling before mounting.

Furthermore, in known laundry appliances (washing machines, washer/driers and driers) the area of the outer dashboard is typically positioned close to a tray or drawer, extractable from the housing of the machine and adapted to be loaded and/or unloaded with liquid/s (detergent/softener/bleach in a washing machine or washer/drier, condensed water in a drier); therefore the outer dashboard may be subject to splashes of water or other liquids, in particular during loading/unloading of the tray/drawer, so that drops may spill by gravity through the dashboard towards the printed circuit board when falling down.

SUMMARY OF SELECTED INVENTIVE ASPECTS

An aim of aspects of the present invention is to provide a laundry appliance comprising a control-panel assembly which can be easily mounted during manufacturing and/or maintenance and which provides additional protection from drops spilling through the dashboard towards the printed circuit board.

According to aspects of the present invention there is provided a laundry appliance comprising a control-panel assembly having:
  an outer shell which is coupled to a casing of the laundry appliance and provides a user interface;
  an internal printed circuit board provided with one or more sensors; and
  a protecting box firmly attached to the printed circuit board and at least partially interposed between the outer shell and printed circuit board;
  one or more spring detectors which transmit to the one or more sensors a signal related to the capacitive variation that is generated when the user interface is touched,
wherein the protecting box has one or more head zones compressing the one or more spring detectors when the protecting box is attached to the printed circuit board, the capacitive variation being sensed by the one or more spring detectors through the one or more head zones.

The head zones keep elastic detector in the proper functioning position when the protecting box is attached to the printed circuit board. The protecting box is more easily mounted to the outer shell.

Furthermore and preferably, though not necessarily, the spring detector is fixed to the printed circuit board, preferably by welding.

In this way the printed circuit board is easily mounted to the protecting box.

Furthermore and preferably, though not necessarily, the shell comprises one or more seats for housing the one or more head zones, the one or more head zones being provided with a respective touch surface for a user.

In this way sensitivity of the sensor is maximum.

Furthermore and preferably, though not necessarily, the one or more head zones face respective one or more touch points of the shell. According to this alternative embodiment of the invention the seal against liquid drops increases.

Furthermore and preferably, though not necessarily, protecting box comprises one or more projecting barriers having a wall to divert drops rolling on the protecting box and hitting the one or more projecting bathers from spilling towards the printed circuit board through the protecting box.

Furthermore and preferably, though not necessarily, the at least one or more head zones are attached to a relative projecting barrier facing the spring detector compressed by the head zone.

Furthermore and preferably, though not necessarily, the wall of at least one of said one or more projecting barriers comprises a tubular wall.

According to the above, spilling of drops towards printed circuit board is avoided.

Furthermore and preferably, though not necessarily, the one or more head zones are a single body with the protecting box, preferably obtained by molding.

Furthermore and preferably, though not necessarily, the protecting box comprises one or more light guides for transmitting to the shell light signals emitted by the printed circuit board.

Furthermore and preferably, though not necessarily, the one or more light guides are a single body with the protecting box, preferably obtained by molding.

The above arrangements provide an easier mounting also in case the control panel configuration is complex.

Furthermore and preferably, though not necessarily, the at least one of the one or more spring detectors comprise a metallic plate pressed against the head zone compressing the spring detector.

According to the above, the detection of capacity is cost effective.

Furthermore and preferably, though not necessarily, protecting box comprises a wall interconnecting the one or more head zones, said wall being interposed between the printed circuit board and the outer shell.

Furthermore and preferably, though not necessarily, there is provided a method of manufacturing a laundry appliance comprising a control panel having:
- an outer shell which is structured for being coupled to a casing of the laundry appliance and providing a user interface;
- an internal printed circuit board provided with one or more sensors; and
- a protecting box firmly attached to the printed circuit board and at least partially interposed between the outer shell and the printed circuit board;
- one or more spring detectors which transmit to the one or more sensors a signal related to the capacitive variation that is generated when the user interface is touched; the method comprising the steps of:
  - attaching the printed circuit board to the protecting box so that one or more head zones of the latter compress the one or more spring detectors;
  - afterwards, attaching the protecting box to the shell, said capacitive variation being sensable in use by the one or more spring detectors through the one or more head zones.

Furthermore and preferably, though not necessarily, the protecting box comprises one or more projecting barriers engaging a respective seat of the shell to define at least a part of the user interface, attaching of protecting box to the shell being such that the projection engages a seat along a straight line.

Furthermore and preferably, though not necessarily, the projecting barrier has a portion located above the upper half of a through hole in a functioning position of the protecting box.

Furthermore and preferably, though not necessarily, the projecting barrier is concave and a through hole is at least partially encircled by the projecting barrier.

Furthermore and preferably, though not necessarily, the protecting box is releasably attached, preferably via a fast-fit connection, to the printed circuit board.

Furthermore and preferably, though not necessarily, the protecting box has lateral walls and the fast-fit connection is between the lateral walls and the printed circuit board.

Furthermore and preferably, though not necessarily, the protecting box is releasably attached to the shell.

Furthermore and preferably, though not necessarily, the protecting box and the printed circuit board are connected to define a preassembled unit to be attached to the shell.

Furthermore and preferably, though not necessarily, light guides and/or another display device engage with the shell when the protecting box is attached to the shell.

Furthermore and preferably, though not necessarily, the spring detector comprises a metallic spring for pressing on the head zone and transporting the signal to the printed circuit board.

Furthermore and preferably, though not necessarily, a seal is provided between the protecting box and the printed circuit.

BRIEF DESCRIPTION OF THE DRAWINGS

A non-limiting embodiment of the present invention will now be described, by way of example, with reference to the accompanying drawings, in which.

DETAILED DESCRIPTION OF EX EXAMPLE EMBODIMENTS

Figure 1:
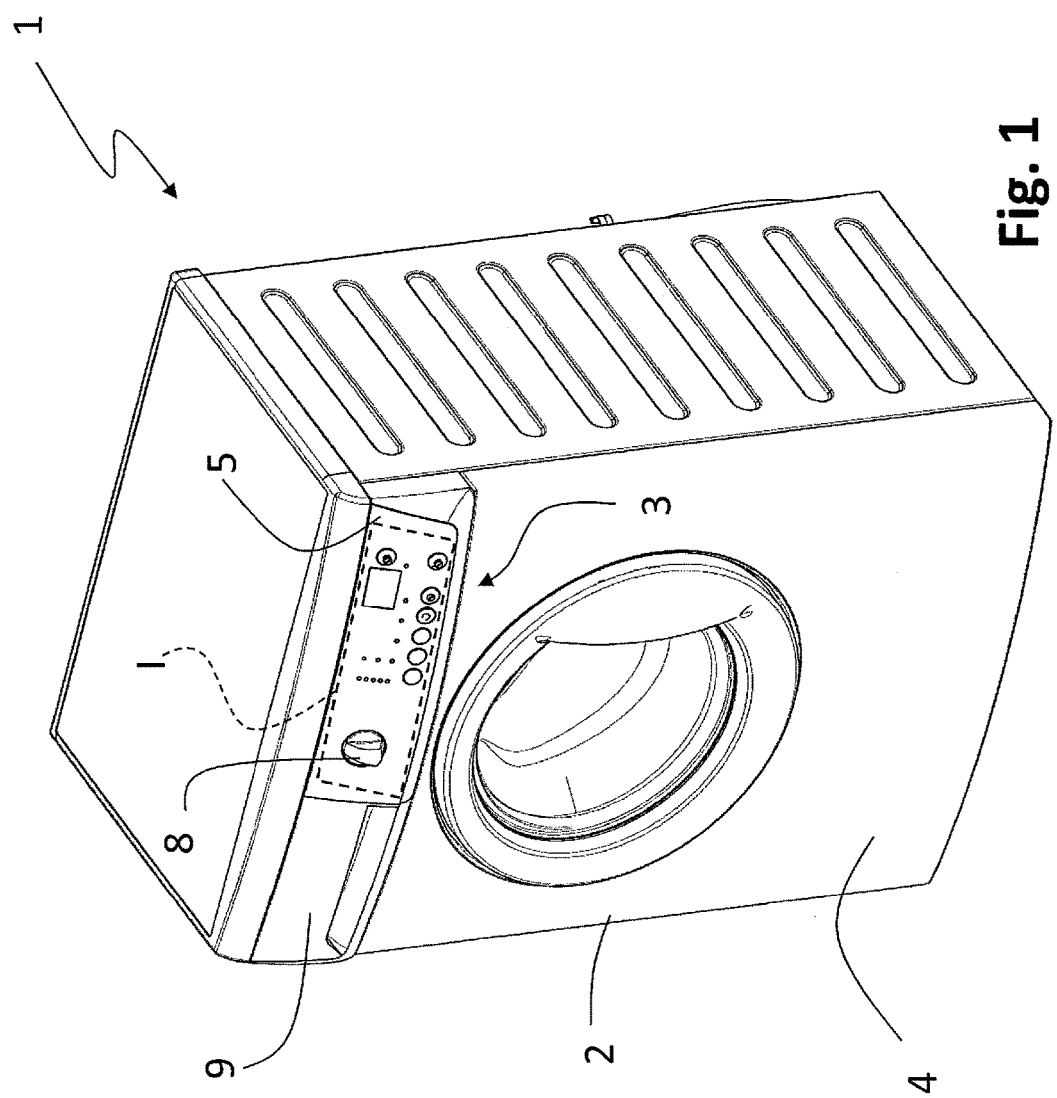
FIG. 1 shows a perspective view of a laundry appliance provided with a control-panel assembly realized in accordance with the teachings of the present invention.

With reference to FIG. 1, number 1 indicates as a whole an electric laundry appliance (in the following called also "laundry appliance" or simply "appliance") 1, such as, for example, a top-loading laundry washing and/or drying machine, a front-loading laundry washing and/or drying machine, comprising an outer boxlike casing 2 and a control panel assembly 3 for manual interaction by a user.

In the example shown, the control panel assembly 3 is suitable for being incorporated into a front wall 4 of the outer boxlike casing 2 of electric laundry appliance 1.

The control-panel assembly 3 mainly comprises an outer shell 5 which is structured for being coupled to the outer boxlike casing 2 of the electric laundry appliance 1, and which forms at least a portion of an outer dashboard of appliance 1; an internal printed circuit board 6 processing manual commands imparted by a user interacting with the control panel assembly 3 and a protecting box 7 having at least a wall interposed between the printed circuit board 6 and the outer shell 5.

Control panel assembly 3 provides a user interface I comprising at least a touch-panel or touch-point and/or a button and/or a switch and/or other manually-operated input device(s), and/or one or more light signals and/or alphanumeric display(s) and/or other display device(s), for example light guides, all controlled by or inputting commands into printed circuit board 6. User interface I of control panel 3 may also provide other commands, for example a knob selector 8 that is not an input for printed circuit board 6 and is connected to another control unit of the laundry appliance 1. The laundry appliance 1 may also comprise an extractable tray 9 for receiving a quantity of detergent or other substances used in the working cycle of laundry appliance 1, or for collecting condensate water in the case of a dryer. Tray 9 and control panel 3 may be located side by side in a top region of laundry appliance 1.

Figure 2:
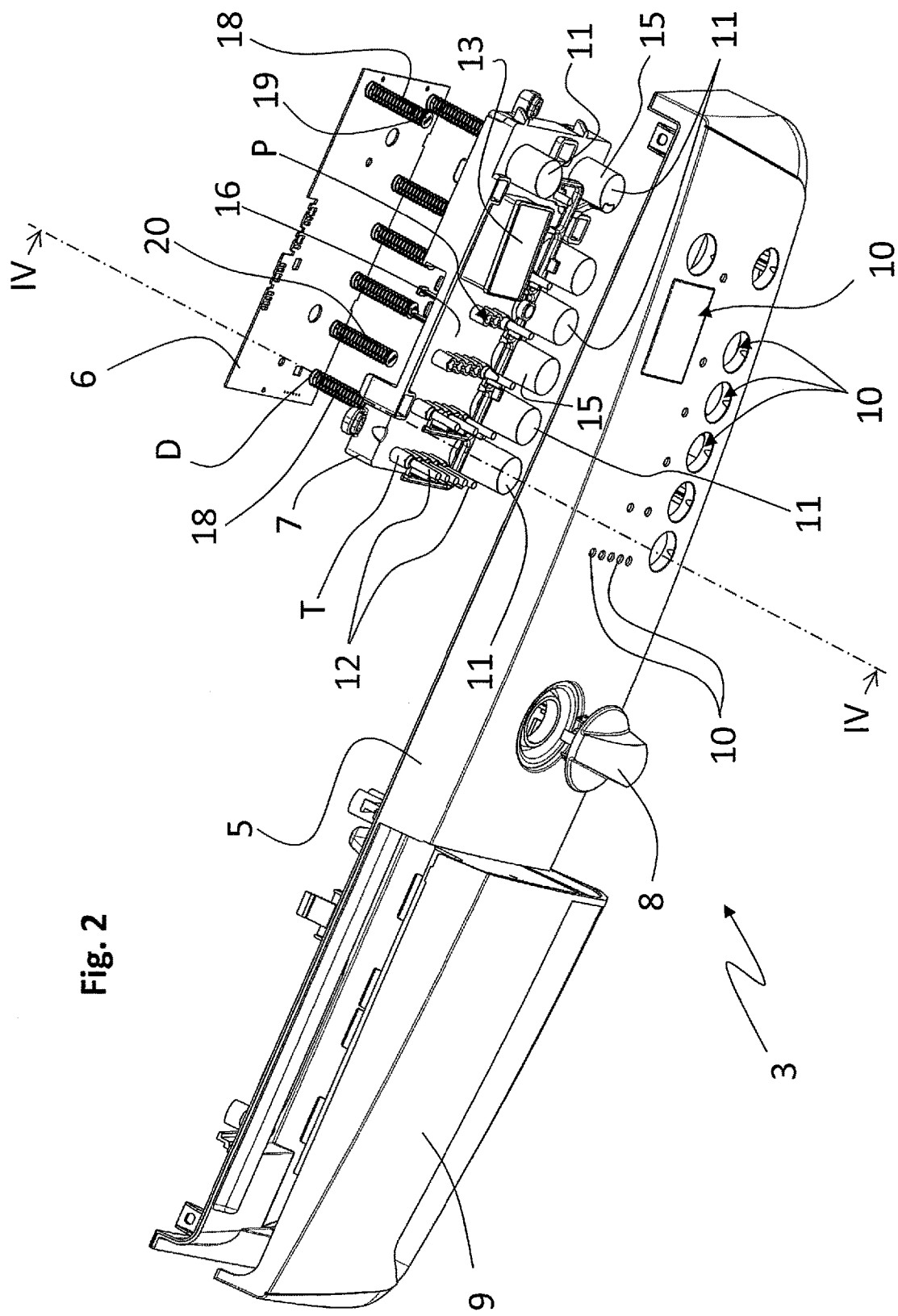
FIG. 2 shows a perspective and partly-exploded view of a control-panel assembly for the laundry appliance of FIG. 1.

According to the embodiment of FIG. 2, the outer shell 5 is moreover advantageously provided with a number of pass-through openings and/or seats, generally indicated with number 10, each of which is dimensioned for being engaged by a respective display device or manually-operated input device interacting with printed circuit board 6.

In the example shown in FIGS. 1 and 2 the outer shell 5 is preferably, though not necessarily, made of plastic material, and the internal printed circuit board 6 is preferably, though not necessarily, arranged locally substantially parallel to and spaced from the outer shell 5.

According to the embodiment of FIG. 2, protecting box 7 comprises one or more head zones 11 that can be positioned in a respective seat 10 of the outer shell 5 and which defines a touch point (or region) for a user in user interface I of control panel 3. Furthermore, protecting box 7 comprises one or more light guides 12 and/or one or more alphanumeric displays 13 housed in a suitably shaped respective seat 10.

Protecting box 7 is structured for being firmly fixed on a rear and internal face of rigid shell 5 so that each projecting display device and/or projecting manually-operated input device for printed circuit board 6 engages the corresponding opening or seat 10. Advantageously, protecting box 7 may be fixed to rigid shell 5 through a releasable connection, preferably a fast-fit connection. The releasable connection may advantageously be such that fixing between shell 5 and protecting box 7 and engagement in seats 10 is obtained through a motion along a straight line, preferably a line that is perpendicular to printed circuit board 6.

For example, fast fit connection advantageously comprises locking tongues or clamps, which stick out of the rear face of shell 5 and are shaped so as to hook on the protecting box 7 when the latter is arranged in the appropriate spatial orientation with respect to the rear face of shell 5.

In the example shown, alphanumeric display 13 comprises a light guide matrix (not illustrated) attached to protecting box 7. Light guide matrix is transparent or translucent and transports light signals generated by light sources on printed circuit board 6, i.e. by LEDs, to the outer surface of shell 5 so that light signals are visible by a user on interface I.

Figure 3:
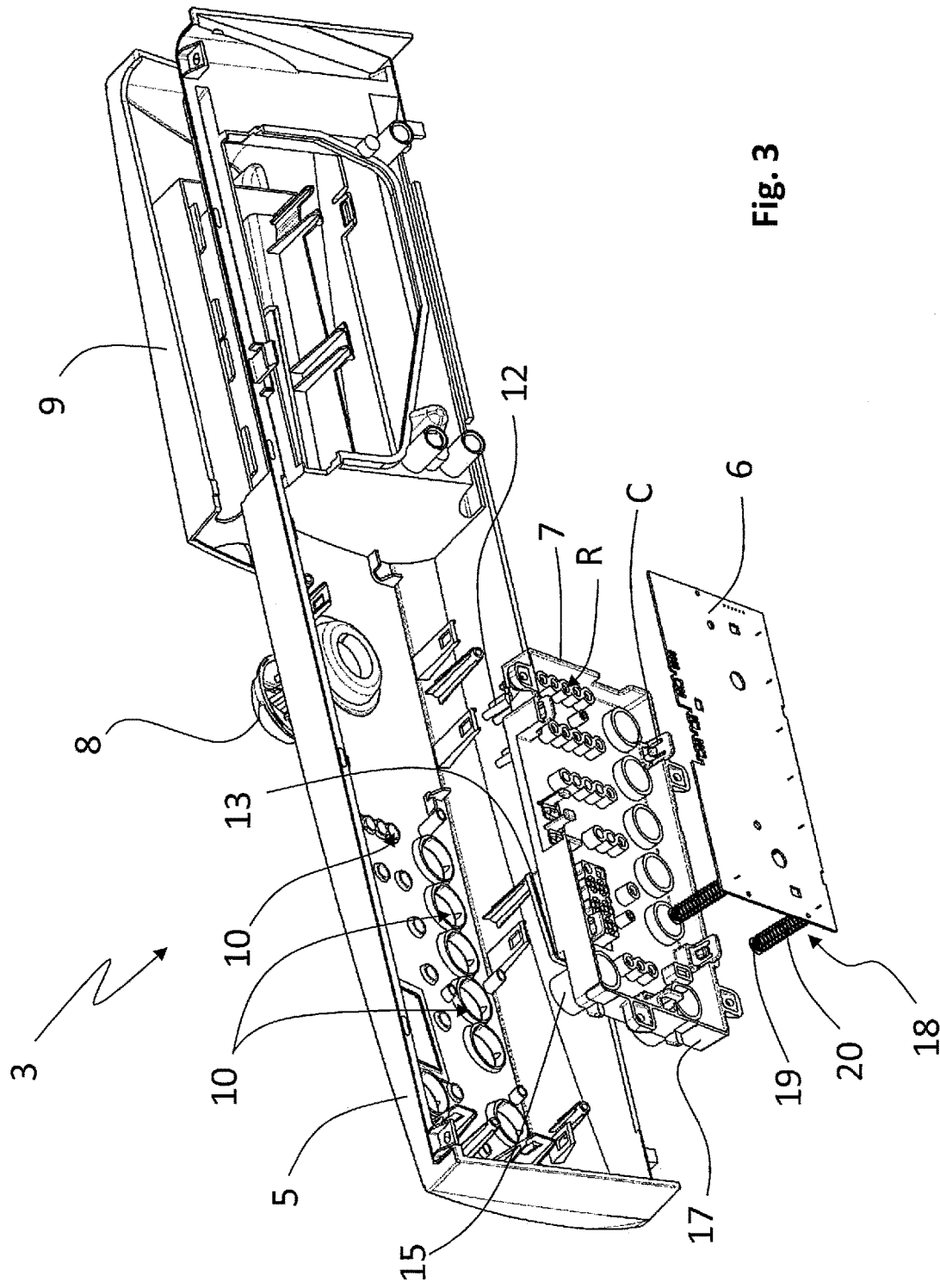
FIG. 3 shows a rear perspective and partly exploded view of the control panel of FIG. 2.
Figure 4:
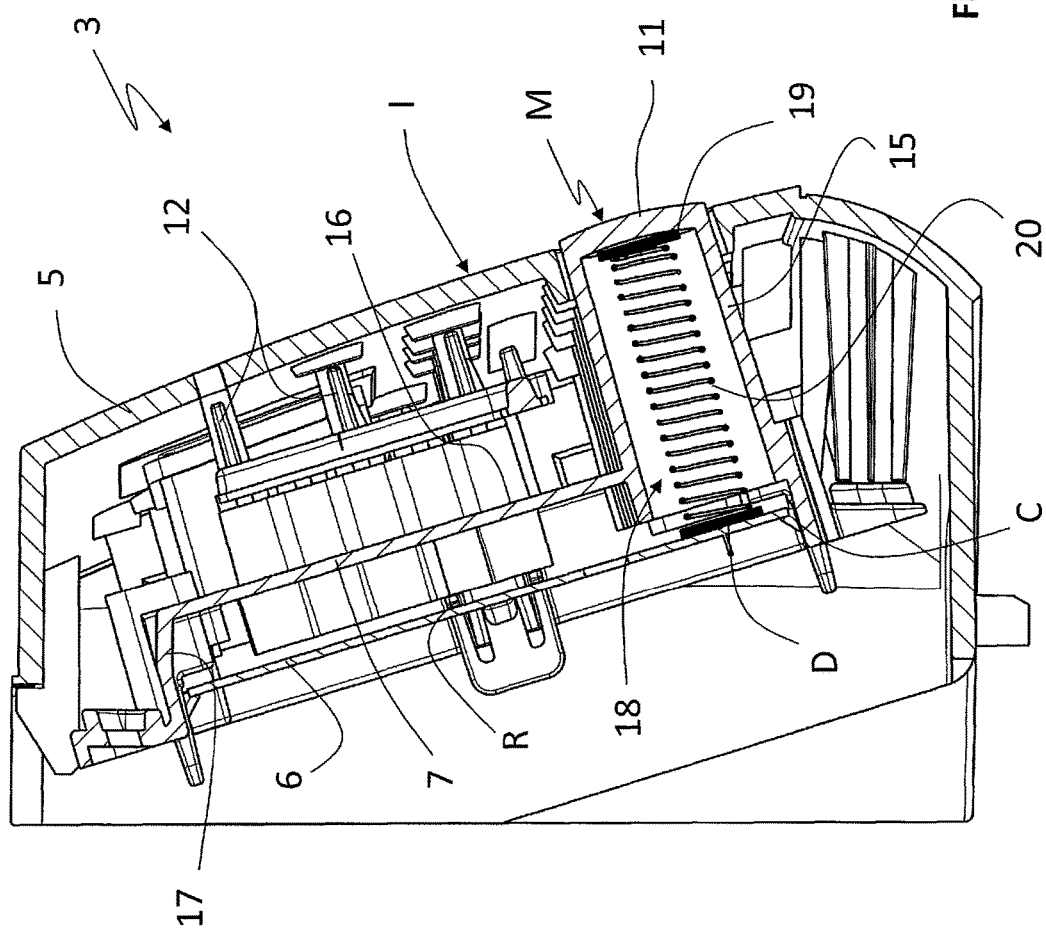
FIG. 4, shows a cross section along plane IV-IV of FIG. 2.

Protecting box 7 also supports light guides 12 that may comprise one or more sticks of a transparent or translucent material having one end R (FIG. 3) facing a light emitter, for example a LED, on printed circuit board 6, and another end 14 housed in a relative seat 10 and visible by the user. Light guides 12 may be detachable or be manufactured as a single body with protecting box 7, for example by co-molding. According to the embodiment of FIG. 2-4, light guides 12 are attached to tubular projections T having a top through opening P for connection with a light guide 12. Preferably, alphanumeric display 13, in particular the light guide matrix of display 13, and/or tubular projections T supporting light guides 12 are projections of the protecting body 7.

Protecting body 7 further comprises tubular projections 15 that preferably project in the same direction as light guides 12 and alphanumeric display 13; tubular projections 15 are closed by a respective head zone 11 on top.

Projections T, 15 are interconnected by a wall portion 16 facing printed circuit board 6, preferably parallel to printed circuit board 6. Projections T, 15 project from wall portion 16 so that a liquid drop rolling by gravity on wall portion 16 when the protecting box 7 is in use is deviated by projections T, 15 and does not spill towards printed circuit board 6 through protecting box 7 so as to remain within an area between shell 5 and protecting box 7. Preferably tubular projections T, 15 are sealed to wall portion 16. Even more preferably tubular projections T, 15 have continuous lateral walls and are a single body with wall portion 16 and head zones 11, preferably obtained by molding.

Protecting box 7 further comprises lateral walls 17 enclosing printed circuit board 6 when the latter is connected to protecting box 7.

Printed circuit board 6 comprises one or more capacitive sensors D and respective spring detectors 18 attached to board 6 and electrically connected to a capacitive sensor D.

According to the embodiment of FIG. 2, a tubular projection 15 houses a respective spring detector 18 when printed circuit board 6 and protecting box 7 are attached. In such a condition, the respective head zone 11 compresses the spring detector 18 so that sensor D on printed circuit board 6 detects a change or variation of capacity through head zone 11 when a finger of the user approaches the head zone 11 or touches a touch surface M (FIG. 4) of head zone 11.

Preferably, spring detector 18 comprises a top metallic plate 19 pressed on the respective head zone 11 when printed circuit board 6 is attached to protecting box 7. Metallic plate 19 is connected to printed circuit board 6 to detect capacity change or variation when a finger of the user approaches head zone 11.

Spring detector 18 may also comprise a metallic spring 20 to electrically connect metallic plate 19 to sensor D on printed circuit board 6. According to the embodiment of FIG. 2, spring detector 18 is long enough to press on head zone 11 located on user interface I of control panel 3. According to the embodiment of FIGS. 2-4, user interface I comprises shell 5, head zones 11 and touch surfaces M of head zones 11, end portions 14 of light guides 12 and display 13. Furthermore, tubular portions 15 and wall portion 16 are between shell 5 and printed circuit board 6, behind user interface I. According to the above, protecting box 7 is partly between shell 5 and printed circuit board 6.

Preferably, spring detector 18 is attached, e.g. welded or soldered, to printed circuit board 6 before printed circuit board 6 is connected to protecting box 7. Connection between printed circuit board 6 and protecting box 7 is preferably releasable and even more preferably a fast-fit connection. Fast-fit clamps may be provided on lateral walls 17 of protecting box 7. Fast-fit clamps may be combined with calibrated abutments C (FIG. 3) onto which printed circuit board 6 is pressed when in connection with the clamps to block printed circuit board 6. Lateral movements of printed circuit board 6 are bounded by lateral walls 17.

Figure 5:
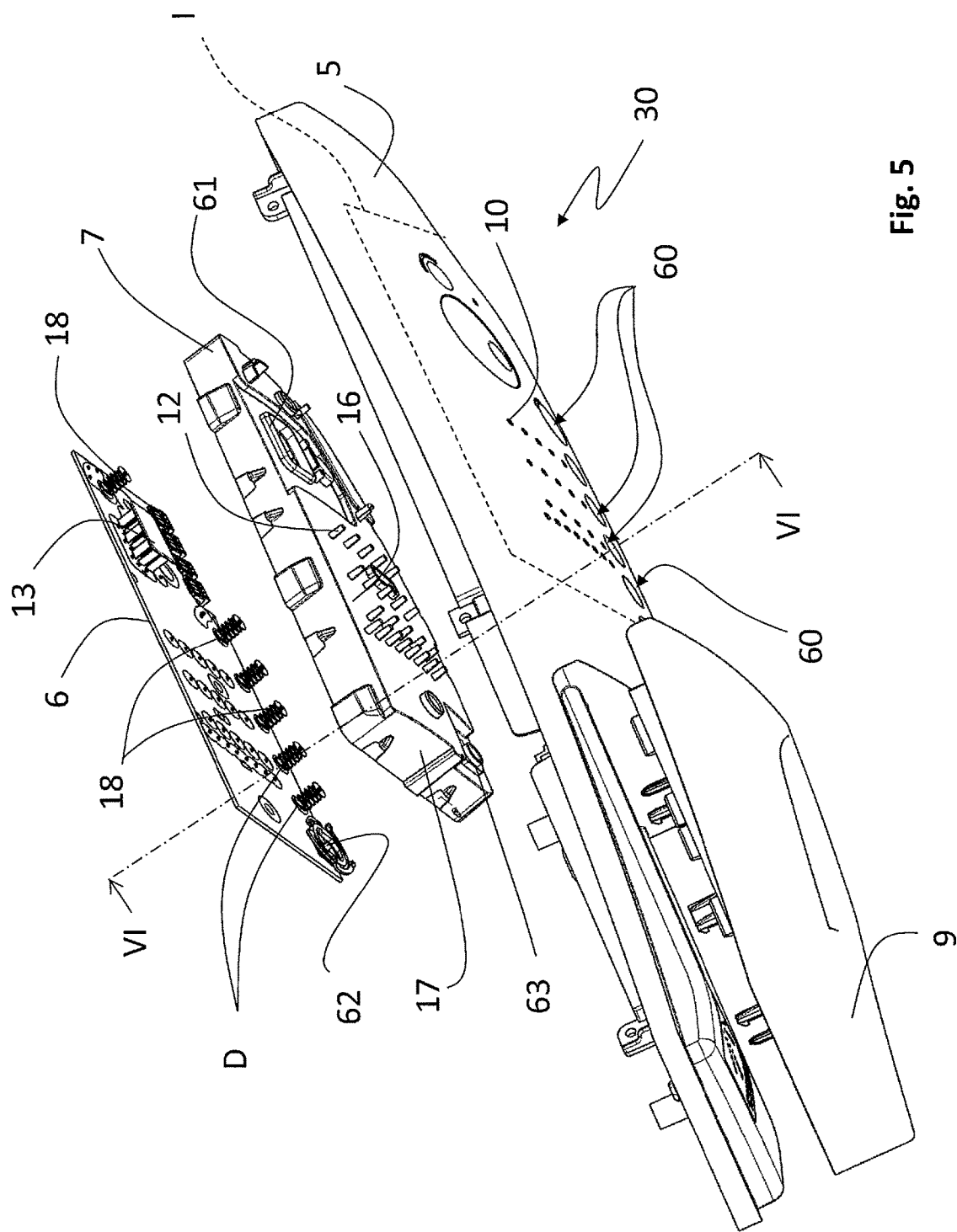
FIG. 5 shows a perspective and partly-exploded view of a control-panel assembly for the laundry appliance of FIG. 1 according to a further embodiment of the present invention.
Figure 6:
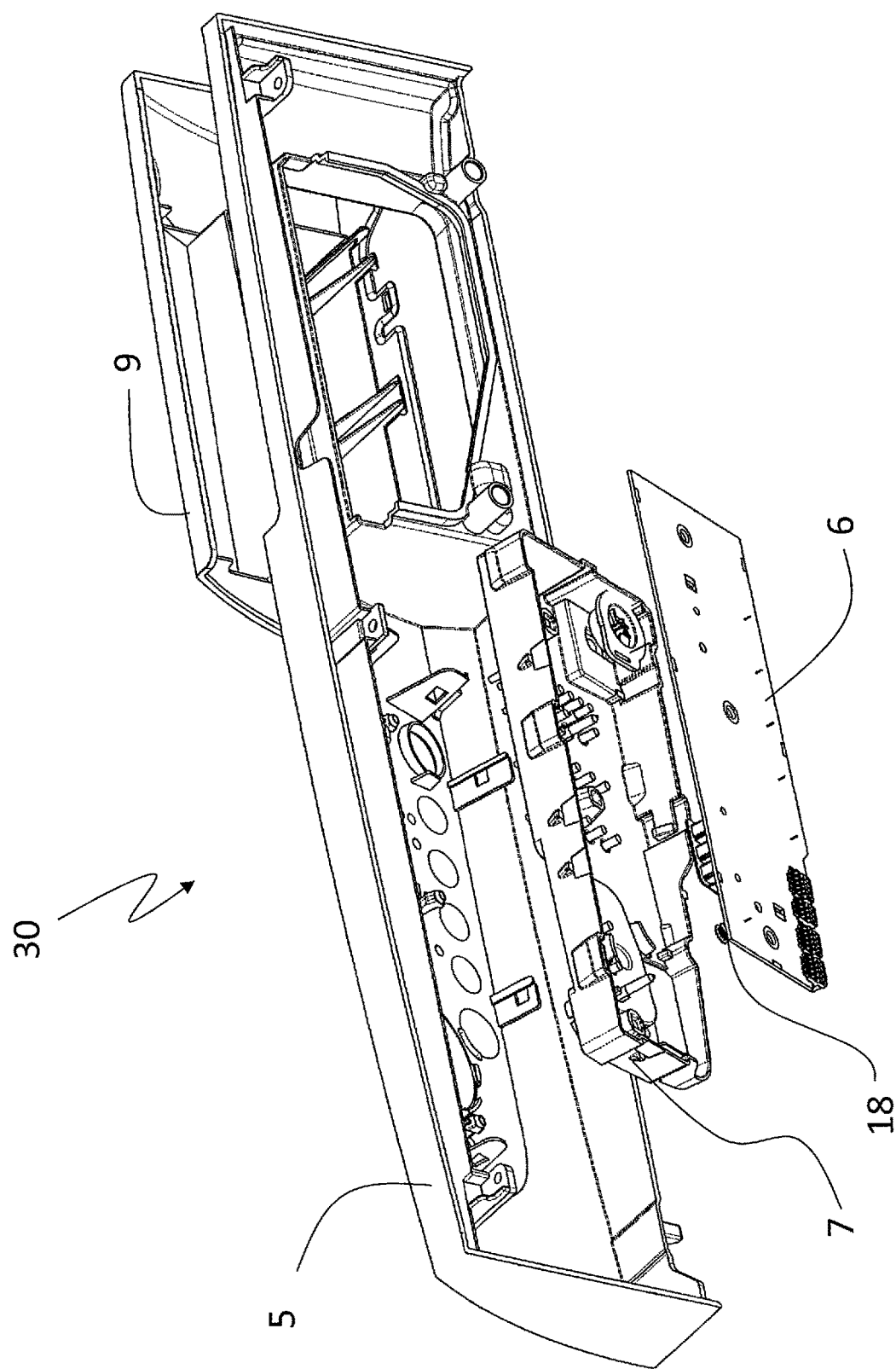
FIG. 6 shows a rear perspective and partly exploded view of the control panel of FIG. 5.
Figure 7:
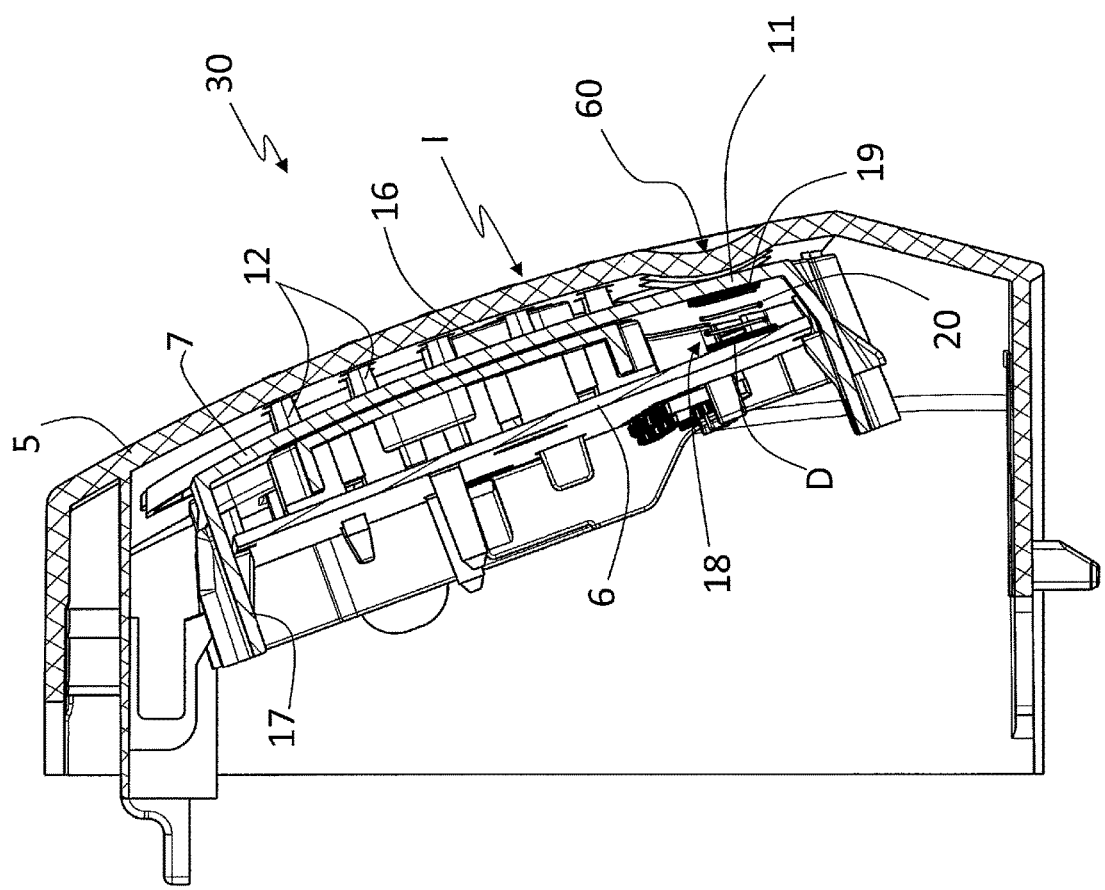
FIG. 7 shows a cross section along plane VI-VI of FIG. 5.

FIGS. 5-7 relate to a control panel 30 according to a further embodiment of the present invention that will be described using the same numerals and appellative used above when there is functional identity with a corresponding element of FIGS. 5-7.

Shell 5 of control panel 30 has seats 10 and touch points (or regions) 60. Touch points 60 are preferably a single body with shell 5 and are identified in use either by suitable images or through a recess and/or projection on shell 5.

Protecting box 7 preferably comprises a single body projecting light guides 12 engaged in respective seats 10 when protecting box 7 is attached to shell 5.

Head zones 11 are preferably flush with wall portion 16 and face, in the assembled condition, a respective touch point 60.

Furthermore, protecting box 7 preferably comprises a tubular projection 61 encircling in use display 13 that is attached to printed circuit board 6.

Printed circuit board 6 of control panel 30 preferably comprises a switch 62 requiring an element, e.g. a shaft or a spacer, passing through protecting box 7 to reach a mobile button on user interface I of control panel 30. User interface I of control panel 30 comprises touch points 60 of shell 5 and, preferably, end portions 14 of light guides 12, but it does not comprise head zones 11, which are positioned behind shell 5, since they belong to the protecting box 7, which is advantageously completely positioned behind the shell 5.

Furthermore, lateral walls 17 of protecting box 7 may extend beyond printed circuit board 6 away from shell 5 due to snap fit connections. Therefore, protecting box 7 is partly between shell 5 and printed circuit box 6. In order to prevent drops from spilling towards printed circuit board 6 through protecting box 7, protecting box 7 comprises a dedicated tubular projection 63 encircling in use the moving shaft or spacer of switch 62. As shown in FIG. 5, projection 63 is provided in a recessed area with respect to a main surface of projecting box 7, i.e. wall portion 16, but the drop deviating function is effective as well. A projection shall be evaluated with respect to immediate surroundings of the through opening to which the projection is associated.

Printed circuit board 6 of FIG. 5 is attached to spring detectors 18 each of which comprises a relative spring 20 that is preferably shorter than spring of FIG. 1.

Indeed, head zones 11 of FIG. 5 are advantageously closer to printed circuit board 6 than those of FIG. 1 because the latter shall reach the external front surface of shell 5.

When the finger of a user approaches touch points 60, the capacity variation is detected by spring detector 18 through head zones 11 and is consequently processed by sensor D on printed circuit board 6.

General operation of the control-panel assemblies 3, 30 is clearly inferable from the above description, with no further explanation required.

During mounting, printed circuit board 6 is connected to protecting box 7 to define a preassembled unit that is later attached to shell 5.

Clearly, changes may be made to the control-panel assembly 3, 30 for household laundry appliances as described above without, however, departing from the scope of the present invention.

For example, a seal, preferably a rubber or silicone seal, not illustrated, can be provided between the lateral walls 17 of the protecting box 7 and printed circuit board 6.

The invention claimed is:

1. Laundry appliance comprising a control-panel assembly having:
   an outer shell which is coupled to a casing of the laundry appliance and provides a user interface;
   an internal printed circuit board provided with one or more sensors; and
   a protecting box firmly attached to the printed circuit board and at least partially interposed between the outer shell and circuit board, wherein the protecting box comprises one or more projecting barriers having a wall to divert drops rolling on the protecting box and hitting said one or more projecting barriers from spilling towards the printed circuit board through the protecting box;
   one or more spring detectors which transmit to said one or more sensors a signal related to the capacitive variation that is generated when the user interface is touched, wherein the protecting box has one or more head zones compressing said one or more spring detectors when the protecting box is attached to the printed circuit board, said capacitive variation being sensed by said one or more spring detectors through said one or more head zone.

2. Laundry appliance according to claim 1, wherein said one or more spring detectors are fixed to the printed circuit board.

3. Laundry appliance according to claim 1, wherein said shell comprises one or more seats for housing said one or more head zones, said one or more head zones being provided with a respective touch surface for a user.

4. Laundry appliance according to claim 1, wherein said one or more head zones face respective one or more touch points of the shell.

5. Laundry appliance according to claim 1, wherein at least one of said one or more head zones are attached to a relative projecting barrier facing the spring detector compressed by said head zone.

6. Laundry appliance according to claim 1, wherein the wall of at least one of said one or more projecting barriers comprises a tubular wall.

7. Laundry appliance according to claim 1, wherein said one or more head zones are a single body with the protecting box.

8. Laundry appliance according to claim 1, wherein the protecting box comprises one or more light guides for transmitting to the shell light signals emitted by the printed circuit board.

9. Laundry appliance according to claim 1, wherein said one or more light guides are a single body with the protecting box.

10. Laundry appliance according to claim 1, wherein at least one of said one or more spring detectors comprises a metallic plate pressed against the head zone compressing said spring detector.

11. Laundry appliance according to claim 1, wherein the protecting box comprises a wall interconnecting said one or more head zones, said wall having at least a portion interposed between the outer shell and the printed circuit board.

12. Method for manufacturing a laundry appliance comprising a control panel having:
- an outer shell which is coupled to a casing of the laundry appliance and provides a user interface;
- an internal printed circuit board provided with one or more sensors; and
- a protecting box firmly attached to the printed circuit board and at least partially interposed between the outer shell and the printed circuit board, wherein the protecting box comprises one or more projecting barriers engaging a respective seat of the shell to define at least a part of the user interface and the step of attaching of the protecting box to the shell is such that said one or more projecting barriers engage a respective seat along a straight line;
- one or more spring detectors which transmit to the one or more sensors a signal related to the capacitive variation that is generated when the user interface is touched;

the method comprising the steps of:
- attaching the printed circuit board to the protecting box so that one or more head zones of the latter compress said one or more spring detectors;
- afterwards, attaching the protecting box to the shell, said capacitive variation being sensable in use by said one or more spring detectors through said one or more head zones.

* * * * *